(12) United States Patent
Hwang et al.

(10) Patent No.: US 6,207,561 B1
(45) Date of Patent: Mar. 27, 2001

(54) SELECTIVE OXIDATION METHODS FOR METAL OXIDE DEPOSITION ON METALS IN CAPACITOR FABRICATION

(75) Inventors: Ming Hwang, Dallas; Robert Tsu, Plano; Wei-Yung Hsu, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/363,801

(22) Filed: Jul. 29, 1999

Related U.S. Application Data
(60) Provisional application No. 60/102,223, filed on Sep. 29, 1998.

(51) Int. Cl.[7] .................................................. H01L 21/421
(52) U.S. Cl. ........................ 438/660; 438/957; 438/909
(58) Field of Search ..................................... 438/660, 957, 438/909

(56) References Cited

U.S. PATENT DOCUMENTS

| 5,336,638 | * | 8/1994 | Suzuki et al. | 437/190 |
| 5,561,082 | * | 10/1996 | Matsuo et al. | 437/187 |

\* cited by examiner

*Primary Examiner*—Richard Booth
*Assistant Examiner*—Jennifer M. Kennedy
(74) *Attorney, Agent, or Firm*—Jacqueline J. Garner; W. James Brady, III; Frederick J. Telecky, Jr.

(57) ABSTRACT

A cost-effective method for fabricating MIM capacitors (120). After metal (106) deposition, the metal oxide (108) is formed using an oxidation chemistry that includes $CO_2$ and $H_2$. The $CO_2/H_2$ gas ratio is controlled for selective oxidation. Thus, the metal (106) is effectively protected from oxidation due to the existence of both $H_2$ and $CO_2$ as strong reduction reagent.

18 Claims, 1 Drawing Sheet

SELECTIVE OXIDATION METHODS FOR METAL OXIDE DEPOSITION ON METALS IN CAPACITOR FABRICATION

This application claims priority under 35 USC §119(e)(1) of provisional application number 60/102,223 filed Sep. 29, 1998.

FIELD OF THE INVENTION

The invention is generally related to the field of forming capacitors in integrated circuits and more specifically to a method of forming metal-insulator-metal capacitors.

BACKGROUND OF THE INVENTION

As semiconductor devices continue to scale to smaller and smaller dimensions, capacitors used in integrated circuits, such as those used in DRAM storage cells, need higher capacitance/unit area. One proposed way to accomplish this is to switch from the conventional polysilicon-insulator-polysilicon capacitors to metal-insulator-metal (MIM) capacitors, such as the one shown in FIG. 1. In the MIM capacitor 10, metals used as the top 12 and/or bottom 14 electrodes are those with low oxygen affinity such as W, Ni, Co, Ir, Ru, and Pt. The insulator 16 is a metal oxide using metals that have a high oxygen affinity. Exemplary metal oxides include $Ta_2O_5$, $Nb_2O_5$, $Al_2O_3$, $Y_2O_3$, $HfO_2$, $TiO_2$, BaO, SrO and the so-called BST ($Ba_xSr_{1-x}TiO_3$, $0<x<1$). These metal oxides have dielectric constant values ranging from 10 to 1000 (depending on material, microstructure, crystalline phase, and crystal orientation).

Currently, $Ta_2O_5$ and BST are considered the most promising capacitor materials for 256 Mbit and 1 Gbit DRAMs. $Ta_2O_5$ and BST can be deposited through reactions of metal-organic precursors and oxygen and annealed in the $O_2$ or UV-$O_3$ ambient. Unfortunately, due to their low oxidation resistance, W, Ni and Co are easily oxidized in the $O_2$ ambient at the high temperatures required. When trying to deposit $Ta_2O_5$ on W, the W oxidizes to form $WO_{3-y}$ which can vaporize and result in a nonuniform dielectric. Moreover, $Ta_2O_{5-y}$ can be produced instead of $Ta_2O_5$. $Ta_2O_{5-y}$ is not stociometric and results in reduced capacitance due to leakage. Although Ir, Ru, and Pt have very high oxidation resistance, they are very expensive and difficult to etch.

One prior art method of selective oxidation for poly-metal gate formation was proposed by Kobayashi et al (Proc. of $15^{th}$ Conf. Solid State Devices and Material p. 217 (1983)). In this method, a wet hydrogen oxidation procedure was developed to allow the silicon to oxidize while leaving the tungsten unaffected in a post gate-etch oxidation. The method is based on thermodynamic calculations which show that at, for example, 1000° C. and a $P(H_2O)/P(H_2)$ ratio (partial pressure ratio of $H_2O$ and $H_2$) of 1.0e-05, the equilibrium:

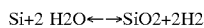

prefers the right side of the reaction, i.e., oxidation of Si and

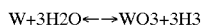

prefers the left side of the reaction, i.e., reduction of $WO_3$ to W. Therefore, under appropriate conditions, it is possible to oxidize silicon again such that the oxidation rate of W will be prevented.

Unfortunately, it is difficult to generate a uniform steam of pure $H_2O$ without heavy metal contaminants because it is hard to completely remove heavy metal from the clean and deionized water used in steam generators for semiconductor device manufacturing. It is also dangerous to generate and control a proper $H_2/H_2O$ gas ratio using a burning process of mixed oxygen and hydrogen under an excessive hydrogen environment.

The above process has been proposed for light thermal oxidation. In the area of non-selective CVD-$SiO_2$, several $CO_2$-$H_2$ gas chemistries have been proposed. One such gas chemistry is $SiH_4$-$CO_2$-$H_2$ and another is $SiH_2Cl_2$-$CO_2$-$H_2$. A $CO_2$-$H_2$ gas chemistry has also been used to produce $H_2O$ for $H_2O$ addition reactions such as $2AlCl_3 + 3H_2O \rightarrow Al_2O_3 + 6HCl$. In addition, CO gas has been used in metallurgy as a strong reduction reagent of metal oxides for metal production.

SUMMARY OF THE INVENTION

A cost-effective method for fabricating MIM capacitors is disclosed herein. After metal deposition, the metal oxide is formed using an oxidation chemistry that includes $CO_2$ and $H_2$. The $CO_2/H_2$ gas ratio is controlled for selective oxidation. Thus, the metal is effectively protected from oxidation due to the existence of both $H_2$ and $CO_2$ as strong reduction reagents.

An advantage of the invention is providing a cost-effective method for fabricating MIM capacitors using a selective metal-oxide deposition.

This and other advantages will be apparent to those of ordinary skill in the art having reference to the specification in conjunction with the drawings.

DETAILED DESCRIPTION OF THE EMBODIMENTS

The invention will now be described in conjunction with a process for forming a MIM capacitor. It will be apparent to those of ordinary skill in the art that the benefits of the invention may be applied to other processes requiring metal oxide deposition over exposed metal.

It is known that $SiH_4$-$CO_2$-$H_2$ and $SiH_2Cl_2$-$CO_2$-$H_2$ may be used to form $SiO_2$ using a blanket CVD process. A preferred embodiment of the invention uses a $CO_2/H_2$ gas ratio in a selective oxidation process to protect the metal electrode during metal-oxide formation. Protection is achieved because $H_2$ and CO are strong reduction reagents. The oxidation-reduction reactions are as follows:

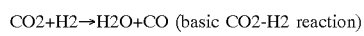

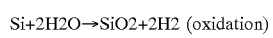

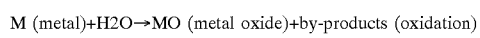

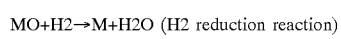

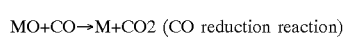

By controlling the CO2/H2 gas ratio, the metal will be effectively protected from oxidation due to the existence of both H2 and CO as strong reduction reagents. The CO2/H2 ratio depends on the material and selective oxidation temperature, which can be chosen based on thermodynamic calculation. For the case with W as the bottom electrode and TaCl5 as the precursor for a Ta2O5 film, a typical CO2/H2 ratio is 1E–5 to1E–1 at a temperature of 727° C.

Metal organic precursors and metal chlorides can react with H2O in either a wet hydrogen or a dry CO2/H2 oxidation procedure to form metal oxides. For example,

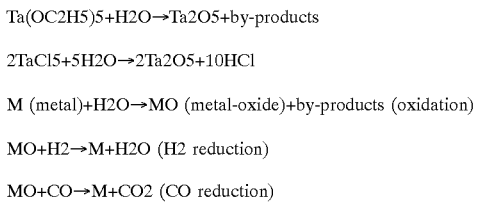

In this example, M refers to the underlying metal electrode for which protection from oxidation is desired. H2 and/or CO are strong reduction reagents and protect the metal from oxidation. Although the above example uses a Ta-organic precursor or a Ta-chloride, the invention can be easily applied with similar reactions to other metal-organic precursors and metal-chlorides having a strong oxygen affinity such as Nb, Al, Y, Hf, Ba, and Sr.

Like Si, the oxygen affinity of Ta, Nb, Al, Y, Hf, Ba, and Sr are stronger than that of W, Ni, and Co. Therefore, under the appropriate process conditions (temperature, gas pressure, ratio, gas flow, etc.) it is possible to oxidize Ta, Nb, Al, Y, Hf, Ba, and/or Sr to form their oxides (Ta2O5, Nb2O5, Al2O3, etc.) such that the oxidation rate of W, Ni, and/or Co is very small. Accordingly, W, Ni, and/or Co may be used for the metal electrodes of a MIM capacitor with oxides of Ta, Nb, Al, Y, Hf, Ba and/or Sr as the capacitor insulator. Alternatively or additionally, metal-nitrides such as TiN, WN, WSiN, or TiSiN may be used for the capacitor electrodes.

Figure 1:
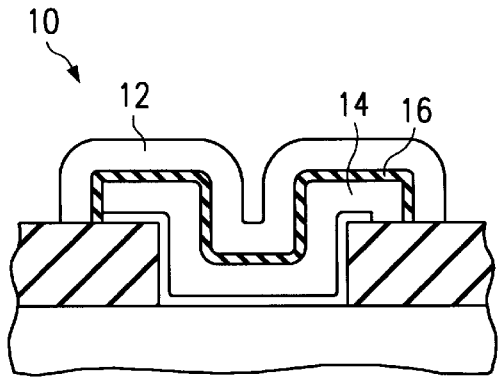
FIG. 1 is a cross-sectional diagram of a previously proposed MIM capacitor.
Figure 2A:
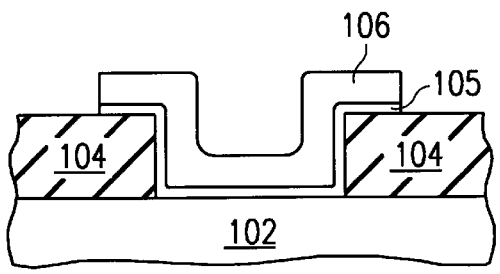
FIGS. 2A–2C are cross-sectional diagrams of a MIM capacitor according to the invention at various stages of fabrication.

A process for forming a MIM capacitor according to a preferred embodiment of the invention will now be described with reference to FIGS. 2A–2C. Referring to FIG. 2A, a semiconductor body 102 is processed through the formation of bottom metal electrode 106. In typical DRAM applications, metal electrode 106 is in electrical contact (through at least a diffusion barrier 105) with semiconductor body 102 and partially extends over dielectric 104. Dielectric 104 is sometimes referred to as an interlevel dielectric (ILD) or a poly-metal dielectric (PMD). Dielectric 104 typically comprises silicon dioxide.

Figure 3:
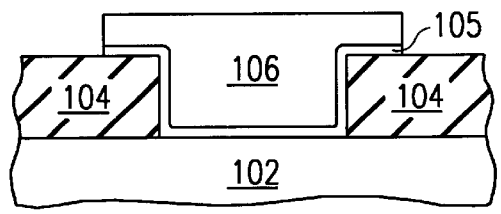
FIG. 3 is a cross-sectional diagram of a MIM capacitor according to the invention having an alternative bottom plate structure.

Bottom metal electrode 106 may be formed by conformal metal deposition to a thickness in the range of 100 Å–1000 Å followed by pattern and etch as shown in FIG. 2A. Alternatively, bottom metal electrode 106 may fill the hole in dielectric 104 as shown in FIG. 3. In that case, the thickness of bottom metal electrode 106 may be in the range of 1000 Å–10000 Å. In the preferred embodiment, bottom metal electrode 106 comprises W. Alternatively, bottom metal electrode 106 may comprise other metals with low oxygen affinity such as Ni or Co or metal nitrides such as TiN, WN, WSiN, or TiSiN.

Figure 2B:
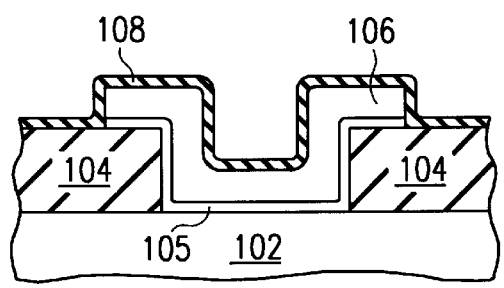

Referring to FIG. 2B, metal-oxide 108 is deposited over bottom metal 106. Metal oxide 108 contains a metal of high oxygen affinity such as Ta, Nb, Al, Y, Hf, Ba or Sr. In the preferred embodiment, metal-oxide 108 comprises Ta2O5. Metal-oxide 108 is deposited used a metal-organic precursor or a metal-chloride and a dry CO2/H2 gas chemistry. The ratio of CO2/H2 is controlled to minimize the oxidation of bottom metal 106. For example, Ta(OC2H5)5 or TaCl5 may be combined with CO2 and H2 to form Ta2O5 with minimal oxidation of bottom metal 106. An example is the growth of Ta2O5 with TaCl5 as a precursor and W as the bottom electrode 106. A typical process condition can be a CO2/H2 ratio between 1E–5 to 1E–1 at a process temperature of 727. The range of the ratio and temperature can be chosen based on thermodynamic calculation. A typical temperature range is between 400–1000° C. The time duration depends on the thickness of the TaO5 film thickness required. The thicker the film, the longer the time needed. For Ta2O5, the thickness of metal oxide 108 may be in the range of 50 Å–300 Å.

After metal-oxide 108 deposition, the metal oxide 108 is preferably annealed in either a wet hydrogen oxidation procedure or a dry CO2/H2 oxidation procedure under appropriate conditions to protect the metal electrode 106 from oxidation.

Figure 2C:
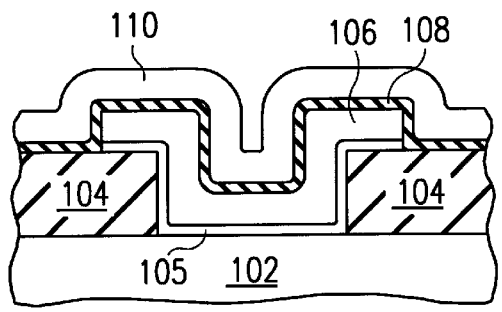

After annealing, the top metal 110 is deposited as shown in FIG. 2C. In the preferred embodiment, top metal 110 also comprises W. Alternatively, top metal 110 may comprise other metals with low oxygen affinity such as Ni or Co or metal nitrides such as TiN, WN, WSiN, or TiSiN.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit, comprising the steps of:
   forming a metal layer over a structure;
   depositing a metal-oxide layer by selectively oxidizing a metal-bearing precursor in the presence of $CO_2$ and $H_2$ to form the metal-oxide layer over at least a portion of said metal layer while substantially protecting said metal layer from oxidation.

2. The method of claim 1, wherein said metal layer is a capacitor electrode.

3. The method of claim 1, wherein said metal layer comprises tungsten.

4. The method of claim 1, wherein said metal layer comprises nickel.

5. The method of claim 1, wherein said metal layer comprises cobalt.

6. The method of claim 1 wherein said metal layer comprises a metal nitride.

7. The method of claim 1, wherein said metal-oxide layer comprises a material selected from the group consisting of $Ta_2O_5$, $NB_2O_5$, $Al_2O_3$, $Y_2O_3$, $HfO_2$, $TiO_2$, $BaO$, $SrO$ and BST.

8. The method of claim 1, further comprising the step of forming a top metal electrode over said metal oxide layer.

9. The method of claim 1, wherein the metal-bearing precursor is a metal-organic precursor.

10. The method of claim 1 wherein the metal-bearing precursor is a metal-chloride.

11. A method of fabricating a capacitor on an integrated circuit comprising the steps of:
    forming a diffusing barrier over a semiconductor body and over a portion of a dielectric formed over the semiconductor body;

forming a first metal electrode over said diffusion barrier;

forming a metal-oxide layer over said first metal electrode by selective oxidation of a metal-bearing precursor, using a chemistry that comprises $CO_2$ and $H_2$ to substantially protect said first metal electrode from oxidation; and forming a second metal electrode over said metal-oxide layer.

12. The method of claim 11, wherein said first and second metal electrodes comprise tungsten.

13. The method of claim 11, wherein said first and second metal electrodes comprise nickel.

14. The method of claim 11, wherein said first and second metal electrodes comprise cobalt.

15. The method of claim 11, wherein said first and second metal electrodes comprise a metal nitride.

16. The method of claim 11, wherein said metal-oxide layer comprises a material selected from the group consisting of $Ta_2O_5$, $NB_2O_5$, $Al_2O_3$, $Y_2O_3$, $HfO_2$ $TiO_2$, BaO, SrO and BST.

17. The method of claim 11, wherein the metal-bearing precursor is a metal-organic precursor.

18. The method of claim 11, wherein the metal-bearing precursor is a metal-chloride.

* * * * *